United States Patent [19]

McMinn et al.

[11] Patent Number: 5,430,394
[45] Date of Patent: Jul. 4, 1995

[54] CONFIGURATION AND METHOD FOR TESTING A DELAY CHAIN WITHIN A MICROPROCESSOR CLOCK GENERATOR

[75] Inventors: Brian D. McMinn, Buda; Stephen C. Horne, Austin, both of Tex.

[73] Assignee: Advanced Micro Devices, Inc., Sunnyvale, Calif.

[21] Appl. No.: 212,037

[22] Filed: Mar. 11, 1994

[51] Int. Cl.⁶ ...................... H03H 11/26; H03K 1/04
[52] U.S. Cl. .................. 327/292; 327/276; 327/277; 327/294; 324/527
[58] Field of Search ............... 324/527; 327/276–277, 327/292, 294

[56] References Cited

U.S. PATENT DOCUMENTS

| | | | |
|---|---|---|---|
| 4,414,637 | 11/1983 | Stanley | 364/569 |
| 5,180,937 | 1/1993 | Laird et al. | 307/602 |

*Primary Examiner*—Margaret Rose Wambach
*Attorney, Agent, or Firm*—Conley, Rose & Tayon

[57] ABSTRACT

A test configuration is provided which allows a plurality of variable delay units within a delay chain of a microprocessor clock generator to be compared with respect to one another. During normal operation, a set of multiplexers interposed within the delay chain are configured such that the plurality of variable delay units are electrically coupled in series with respect to one another. An external command signal may be provided to the microprocessor to initiate a test operation in which the variable delay units are tested for possible defects. During the test operation, a control unit selects the multiplexers such that the four delay units are electrically separated from one another. A common test signal is then driven through two or more of the variable delay units simultaneously, and a compare circuit coupled to the output of each variable delay unit determines whether a transition in the common pulse signal propagated through each variable delay unit at essentially the same time. If no manufacturing defects are present, the four outputs of the variable delay units should be virtually indistinguishable from one another. The results of the compare operation may be driven on external pins of the microprocessor or may be processed internally within the microprocessor. Similar tests may be conducted throughout the entire operating range of the variable delay units.

20 Claims, 5 Drawing Sheets

CONFIGURATION AND METHOD FOR TESTING A DELAY CHAIN WITHIN A MICROPROCESSOR CLOCK GENERATOR

BACKGROUND OF THE INVENTION

1. Field of the Invention

This invention relates to clock generator circuits employed within microprocessing units and more particularly to the testing of delay chains incorporated within microprocessor clock generators. The invention also relates to the testing of electrical delay circuits which have controllable delay characteristics.

2. Description of the Relevant Art

Most microprocessors include an on-chip clock generator circuit for synthesizing internal clock signals. One important requirement is that the internal clock signals be associated with very stable frequency and duty cycle characteristics. Within one exemplary microprocessor clock generator, this is achieved by using a plurality of identical variable delay elements coupled in series to form a delay chain from which timing reference signals may be derived. The timing reference signals are used to trigger transitions in a generated clock signal. Within such clock generators, it is important that the relative delays of the variable delay elements be essentially identical to achieve a desired duty cycle of 50 percent. Accordingly, it may be desirable to test the variable delay elements to determine whether they actually have essentially identical delays.

Although it is relatively simple to fabricate virtually identical delay elements on a single integrated circuit chip, batch-to-batch variations due to processing variations make it very difficult to fabricate a delay element in which a certain control input value will always yield the same fixed time delay. Fortunately, with respect to the above-mentioned clock signal generators, it is only necessary that the relative delays of the variable delay elements within a particular clock generator be essentially identical. The actual delay values are not critical. In view of this, it may not be possible or may not be cost-effective to test this class of delay element by simple comparison with a known reference delay.

A further consideration with respect to the test of delay elements within clock generator circuits is the type of possible defect. In an integrated circuit manufacturing test, it is assumed that the fundamental design of the delay element is sound and that only failures introduced by manufacturing defects remain. A manufacturing defect will not necessarily cause the delay element to fail entirely but may rather subtly or dramatically affect the relationship between the control input and the time delay of the delay element. Complete failure of the delay element is easily detected, but subtle manufacturing defects in delay elements are very difficult to detect.

Accordingly, a test configuration and method are desirable wherein variably controlled delay elements embodied within a microprocessor clock generator may be readily tested for subtle defects without the need for costly calibration of individual delay elements.

SUMMARY OF THE INVENTION

The problems outlined above are in large part solved by a configuration and method for testing a delay chain within a microprocessor clock generator according to the present invention. In one embodiment, a test configuration is provided which allows a plurality of variable delay units within the delay chain to be compared with respect to one another. The delay chain is employed within a clock generator circuit that generates internal clock signals of a microprocessor. During normal operation, a set of multiplexers interposed within the delay chain are configured such that the plurality of variable delay units are electrically coupled in series with respect to one another. As a result, a pulse signal may be provided to an input line of the delay chain such that it propagates consecutively through each variable delay unit to an output line of the delay chain. Since each variable delay unit is associated with an identical delay, a tap point within each variable delay unit may be utilized to generate a clock signal having a precisely controlled duty cycle.

An external command signal may be provided to the microprocessor to initiate a test operation in which the variable delay units are tested for possible defects. During the test operation, a control unit selects the multiplexers such that the plurality of delay units are electrically separated from one another. A common test signal is then driven through two or more of the variable delay units simultaneously, and a compare circuit coupled to the output of each variable delay unit determines whether a transition in the common pulse signal propagated through each variable delay unit at essentially the same time. If no manufacturing defects are present, the four outputs of the variable delay units should be virtually indistinguishable from one another. The results of the compare operation may be driven on external pins of the microprocessor or may be processed internally within the microprocessor. Similar tests may be conducted throughout the entire operating range of the variable delay units. The test configuration and method advantageously allow the a delay chain of a microprocessor clock generator circuit to be tested for subtle defects without the need for costly calibration of individual delay elements and without the need for testing the actual delay of each delay element.

Broadly speaking, the present invention contemplates a variably controllable delay circuit comprising a plurality of variable delay units each including an input line, an output line, and a control line for controlling an electrical delay associated therewith, and a switching unit interposed between the plurality of variable delay units. The switching unit is capable of electrically coupling the plurality of variable delay units in series during a first mode of operation, and is further capable of electrically decoupling the plurality of variable delay units such that a test signal can be simultaneously provided to the input line of each of the plurality of variable delay units. The delay circuit further comprises a compare unit coupled to the output lines of at least a pair of the variable delay units, wherein the compare unit is capable of determining whether a transition of the test signal provided simultaneously to the input lines of the pair of variable delay units has propagated to the output lines of the pair of variable delay units within a relative time range.

The present invention further contemplates a method for testing a delay chain including a plurality of variable delay units capable of being electrically coupled in series with respect to one another. The method comprises the steps of electrically decoupling an output line of a first variable delay unit from an input line of a second variable delay unit, providing a test signal simultaneously to the first variable delay unit and to the second variable delay unit, and causing a signal transition to occur in the test signal. The method comprises the further steps of monitoring an output line of the first variable delay unit while monitoring an output line of the second variable delay unit, and determining whether a corresponding transition at the output line of the first variable delay unit occurs within a relative time range of when a corresponding transition at the output line of the second variable delay unit occurs.

Broadly speaking, the present invention contemplates a microprocessor comprising a clock generator including a plurality of variable delay units, and a switching unit interposed between the plurality of variable delay units, wherein the switching unit is capable of electrically coupling the plurality of variable delay units in series during a first mode of operation, and wherein the switching unit is further capable of electrically decoupling the plurality of variable delay units such that a test signal is capable of being simultaneously provided to the input line of each the plurality of variable delay units. The microprocessor further comprises a compare unit coupled to the output lines of at least a pair of the variable delay units, wherein the compare unit is capable of determining whether a transition of the test signal provided simultaneously to the input lines of the pair of variable delay units has propagated to the output lines of the pair of variable delay units within a relative time range. The microprocessor finally comprises a pulse generator coupled to the switching unit and capable of generating the transition of the test signal, and a control unit coupled to the switching unit and capable of receiving a command signal to initiate a test of the clock generator and capable of controlling a switching state of the switching unit.

The present invention further contemplates a method for testing a delay chain within a clock generator of a microprocessor including a plurality of variable delay units capable of being electrically coupled in series with respect to one another. The method comprises the steps of providing a test command signal to a control unit of the microprocessor, electrically decoupling an output line of a first variable delay unit from an input line of a second variable delay unit in response to the test command signal, and providing a test signal simultaneously to the first variable delay unit and to the second variable delay unit. The method comprises the further steps of causing a signal transition to occur in the test signal, monitoring an output line of the first variable delay unit while monitoring an output line of the second variable delay unit, and determining whether a corresponding transition at the output line of the first variable delay unit occurs within a relative time range of when a corresponding transition at the output line of the second variable delay unit occurs.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereby are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
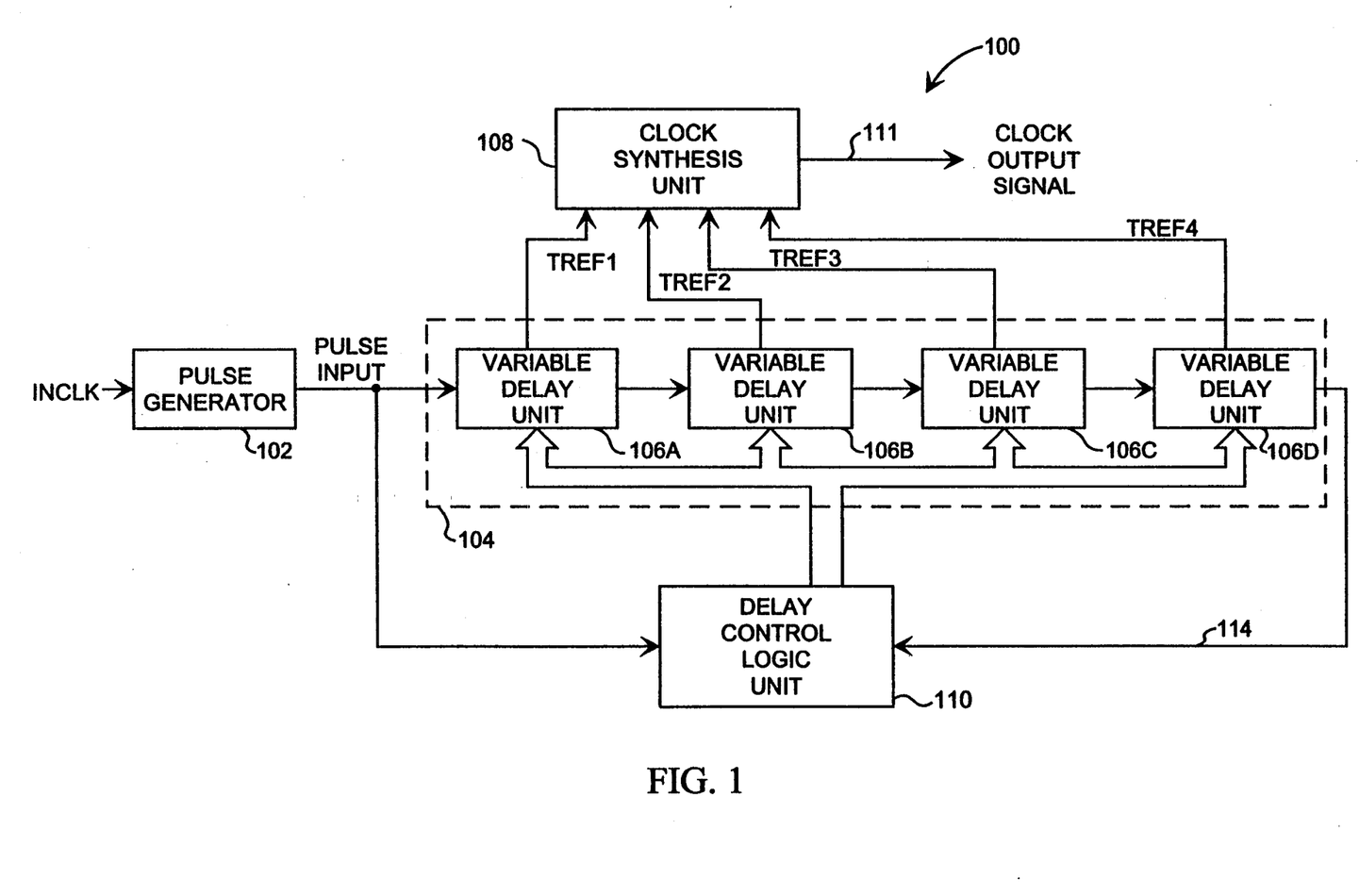
FIG. 1 is a block diagram of a microprocessor clock generator circuit that employs a delay chain including a plurality of variable delay units.

Referring now to the drawings, FIG. 1 is a block diagram of a clock waveform generator circuit 100 for generating a clock signal within a microprocessor. The waveform generator 100 comprises a pulse generator 102 coupled to a delay chain 104 including a plurality of variable delay units 106A–106D. Delay chain 104 is further coupled to a clock synthesis unit 108 and a delay control logic unit 110. The clock waveform generator of FIG. 1 receives an externally generated clock signal labeled INCLK at an input line of pulse generator 102, and generates a clock output signal at an output line 111 of clock synthesis unit 108.

It is noted that while the externally generated clock signal INCLK is associated with stable frequency characteristics, variations in its duty cycle may occur. The clock waveform generator circuit illustrated in FIG. 1 is provided to generate a clock output signal at line 111 having both stable frequency characteristics and a stable duty cycle. For the embodiment of FIG. 1, the clock output signal at line 111 may be either the same frequency or twice the frequency of signal INCLK, though any integer (or half integer) multiple of the frequency of signal INCLK is possible if the number of variable delay units 106A–106D incorporated within the clock waveform generator is varied.

The clock waveform generator of FIG. 1 conforms generally to that described within the co-pending, commonly assigned patent application entitled "Digital Clock Waveform Generator and Method for Generating a Clock Signal" by Horne, et al., Ser. No. 011,068, filed Jan. 29, 1993. This patent application is incorporated herein by reference in its entirety. In the interest of simplicity and clarity, only those portions of the digital clock waveform generator of FIG. 1 as they relate to the present invention are discussed herein. Additional details regarding an exemplary digital clock waveform generator may be found within the above-referenced patent application.

Generally speaking, the variable delay units 106A–106D are configured identically. During operation, pulse generator 102 generates a pulse at a fixed frequency which passes sequentially through each variable delay unit 106A–106D and into delay control logic unit 110 via line 114. Delay control logic unit 110 includes circuitry that monitors the time at which a particular pulse exits the variable delay unit 106D relative to the time at which a subsequent pulse generated by pulse generator 102 enters variable delay unit 106A. Delay control logic unit 110 responsively adjusts the delays of the variable delay units 106A–106D such that the overall delay of delay chain 104 equals one period of the pulse signal generated by pulse generator 102.

A set of timing reference signals labeled TREF1–TREF4 are derived at corresponding locations within the variable delay units 106A–106D. As a signal transition (induced by pulse generator 102) propagates down the delay chain 104 from the input of variable delay unit 106A to the output of variable delay unit 106D, corresponding signal transitions sequentially appear within the timing reference signals TREF1–TREF4. Since each variable delay unit 106A–106D has the same delay with respect to the others, and since the timing reference signals TREF1–TREF4 are derived at corresponding tap points within each variable delay unit 106A–106D, clock synthesis unit 108 can utilize the timing reference signals TREF1–TREF4 to generate a clock output signal having a precisely controlled duty cycle. That is, since the four timing reference signals TREF1–TREF4 represent four equally spaced taps from the delay chain 104, the timing reference signals may be used by clock synthesis unit 108 to trigger transitions in the clock output signal. The timing reference signals TREF1–TREF4 are equally spaced in the sense that signal TREF2 produces a rising edge one-fourth of an INCLK period after signal TREF1 produces a rising edge. Similarly, signal TREF3 produces a rising edge one-fourth of an INCLK period after signal TREF2, and signal TREF4 produces a rising edge one-fourth of an INCLK period after signal TREF3 produces a rising edge. As a result, the clock synthesis unit 108 is capable of generating a clock output signal having a frequency twice that of the INCLK signal with a duty cycle of 50 percent.

As stated previously, it is necessary that the relative delays of the variable delay units 106A–106D be essentially identical. Thus, there is a need to test the variable delay units 106A–106D to ensure that, for example, no manufacturing defects are present. It is noted that if one of the variable delay units 106A–106D has a manufacturing defect which affects its relative delay, the duty cycle of the generated clock output signal at line 111 will not be associated with a desired duty cycle of 50 percent.

Figure 2:
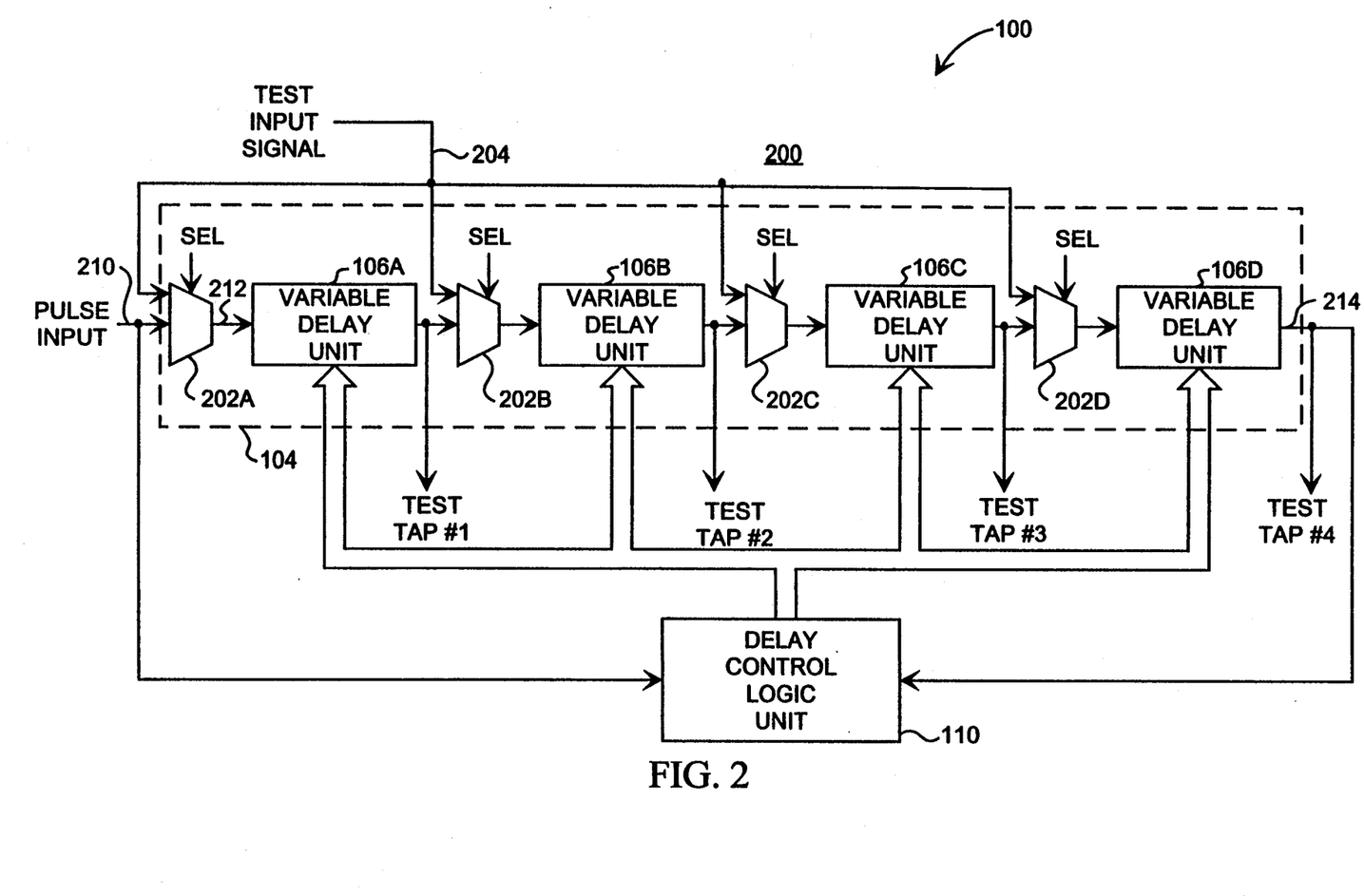
FIG. 2 is a block diagram of a portion of the microprocessor clock generator circuit wherein the delay chain is modified to include a set of multiplexers interposed within the delay chain for allowing a test of the variable delay units in accordance with the present invention.

Therefore, referring next to FIG. 2, a block diagram is illustrated of a portion 200 of the clock generator circuit of FIG. 1 modified to include a test configuration according to the present invention. Circuit portions that correspond to those of FIG. 1 are numbered identically. It is noted that selected circuit blocks incorporated within the clock generator of FIG. 1 have been omitted from FIG. 2 for simplicity and clarity.

As illustrated in FIG. 2, a set of multiplexers 202A–202D are interposed within the delay chain 104 such that the variable delay units 106A–106D can be electrically decoupled from one another during a test mode. In this embodiment, multiplexer 202A is configured to control the selection of an input to variable delay unit 106A, multiplexer 202B is configured to control an input to variable delay unit 106B, multiplexer 202C is configured to control an input to variable delay unit 106C, and multiplexer 202D is configured to control an input to variable delay unit 106D.

During normal operation of the clock generator circuit, multiplexers 202A–202D are selected such that the pulse input signal at line 210 (from the pulse generator 102 of FIG. 1) is electrically coupled through the delay chain 104 from an input 212 of variable delay unit 106A, through each variable delay unit 106A–106D, and to the output 214 of variable delay unit 106D. It is noted that during this mode of operation, multiplexers 202A–202D are selected such that variable delay units 106A–106D are electrically coupled in series with respect to one another. This allows the generation of the timing reference signals, as described previously.

During testing, the multiplexers 202A–202D are selected such that the variable delay units 106A–106D are no longer electrically coupled in series with respect to one another. Multiplexer 202B electrically decouples the output of variable delay unit 106A from the input of variable delay unit 106B, multiplexer 202C electrically decouples the output of variable delay unit 106B from the input of variable delay unit 106C, and multiplexer 202D electrically decouples the output of variable delay unit 106C from the input of variable delay unit 106D. Multiplexer 202A similarly decouples the input of variable delay unit 106A from the pulse generator 102 (of FIG. 1). Instead, during this mode of operation, a test input signal at line 204 is allowed to be simultaneously coupled through each multiplexer 202A–202D and through each variable delay unit 106A–106D independently. An output signal from each variable delay unit 106A–106D may thus be monitored at a respective tap point (test tap#1–test tap#4) derived from the output line of each variable delay unit 106A–106D, as will be described in greater detail below.

When multiplexers 202A–202D are set in the test mode, the test input signal at line 204 is driven with a step transition such that a rising signal edge propagates simultaneously through each variable delay unit 106A–106D. If no manufacturing defects are present, the times at which the rising edge transitions appear at the four test tap outputs (test tap#1–test tap 4) should be virtually indistinguishable.

Figure 3:
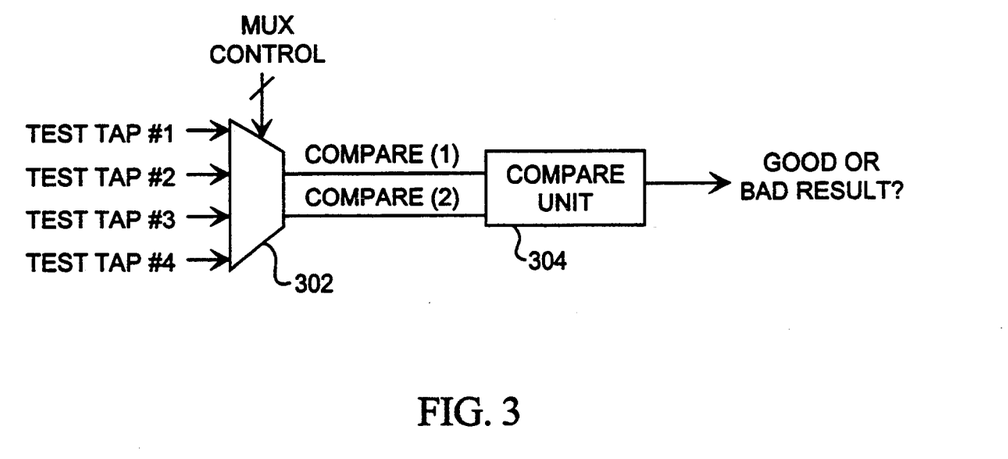
FIG. 3 is a block diagram of a test circuit that allows the comparison of selected variable delay units.

FIG. 3 is a block diagram of a test circuit that allows the four test tap outputs (test tap#1–test tap#4) of FIG. 2 to be compared against one another. The four test tap outputs are provided to a multiplexer 302 which channels a selected two of the test tap outputs to a compare unit 304. It is noted that the incorporation of multiplexer 302 allows the use of only one comparator circuit 304.

During operation, multiplexer 302 is selected such that test tap#1 and test tap#2 are first channeled through the multiplexer to the outputs of multiplexer 302 labelled Compare(1) and Compare(2), respectively. Subsequently, when a rising edge transition occurs in the test input signal at line 204 (FIG. 2), the transition propagates through variable delay units 106A and 106B and through multiplexer 302 to compare unit 304. The time at which a corresponding transition occurs at the output of each variable delay unit 106A and 106B may thereby be compared to the other by compare unit 304. If the transitions do not occur at essentially the same time, compare unit 304 indicates a bad result. On the other hand, if the signal transitions occur at essentially the same time, the compare unit 304 indicates a good result.

Multiplexer 302 is subsequently selected such that test tap#2 is compared against test tap#3. Another rising edge transition to the test input signal at line 204 is again induced, and the transition propagates through variable delay units 106B and 106C. Compare unit 304 then determines whether corresponding transitions occurred at the outputs of the variable delay units 106B and 106C at essentially the same time. A similar test is thereafter applied with respect to test tap#3 and test tap#4, and possibly with respect to test tap#4 and test tap#1.

By employing the test described above, it may be determined whether the variable delay units 106A–106D each have the same relative delay. If one or more of the variable delay units 106A–106D has a different delay characteristic with respect to the others, thus suggesting that a manufacturing defect may be present, the deviation in delay will be detected by compare unit 304 during the test. It is noted that multiplexer 302 may be configured and controlled such that different combinations of pairs of test tap outputs (from those chosen above) may be selectively compared while achieving the same result. It is further noted that the variable delay units 106A–106D may be tested throughout their entire operating range by adjusting their control inputs and repeatedly testing the relative delays of the various units.

Figure 4:
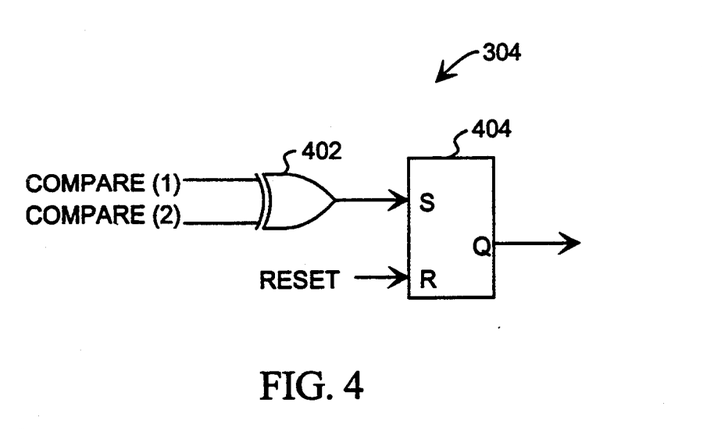
FIG. 4 is a schematic diagram that illustrates one implementation of a compare unit employed within the test circuit of FIG. 3.

FIG. 4 illustrates one implementation of a compare unit 304. The compare unit of FIG. 4 includes an exclusive OR gate 402 and an SR-latch 404. Upon preparation for the test of each selected pair of variable delay units 106A–106D, the reset signal is asserted, thus setting the output of latch 404 low. Subsequently, when the rising edge transitions at the Compare(1) and Compare(2) lines occur, exclusive OR gate 402 transitions high only if the signals at the two input lines are driven high at different times. That is, if the input lines of exclusive OR gate 402 transition from low to high at essentially the same time, the output line will not go high. On the other hand, if the input signals to exclusive OR gate 402 make transitions at significantly different times, the output of exclusive OR gate 402 will go high, thus setting latch 404. It is noted that a small time deviation with respect to the transitions of the two input signals may not be detected, as determined by the specific electrical characteristics (i.e., response time) of exclusive OR gate 402. The setting of latch 404 indicates a bad result.

Figure 5:
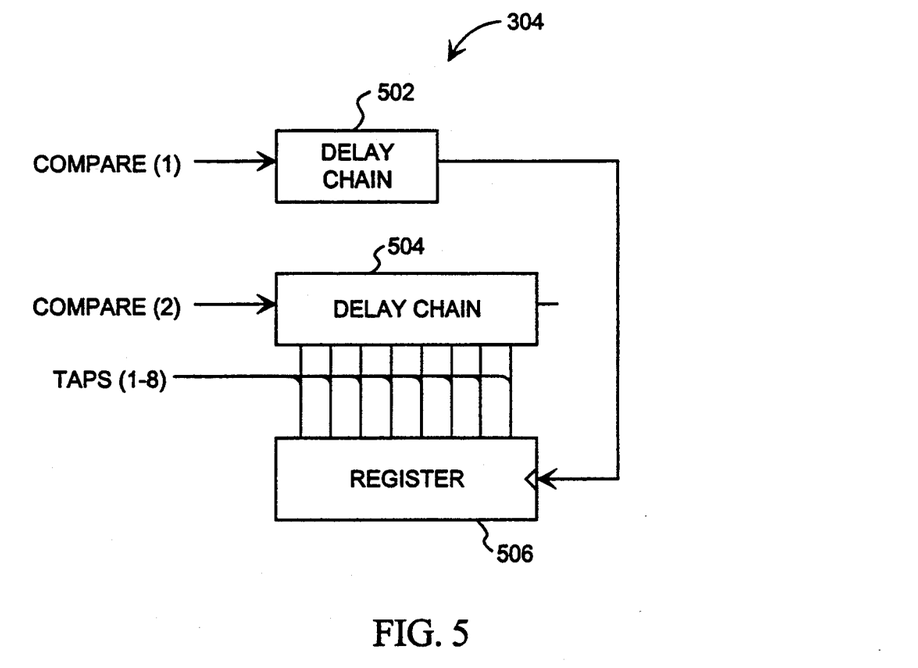
FIG. 5 is a block diagram that illustrates another implementation of a compare unit employed within the test circuit of FIG. 3.

FIG. 5 is a block diagram that illustrates another implementation of a compare unit 304 which may be employed to compare the relative delays of variable delay units 106A–106D. The compare unit of FIG. 5 not only allows for the determination of whether respective rising edge transitions from the variable delay units 106A–106D occur at essentially the same time, but further allows a relative measure of how different a particular delay unit is from another. This may allow the user to vary the strictness of the manufacturing test without changing the compare structure itself.

Figure 6:
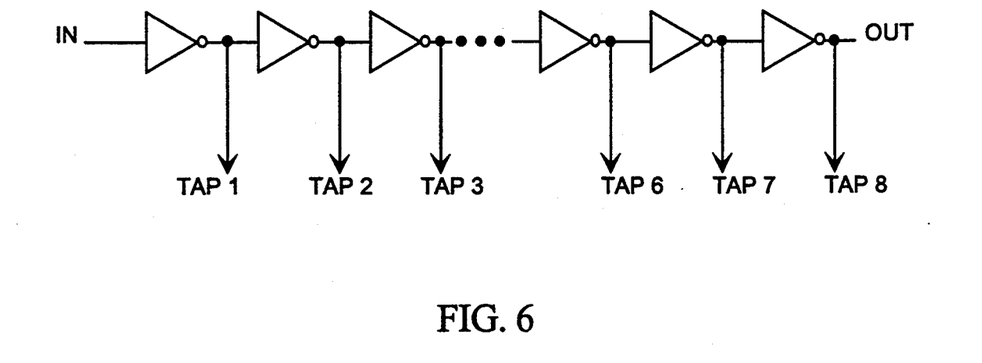
FIG. 6 is a schematic diagram that illustrates an exemplary delay chain employed within the compare unit of FIG. 5.

As illustrated in FIG. 5, the compare unit includes a delay chain 502, a delay chain 504, and a register 506. An input of delay chain 502 is connected to the Compare(1) line (from multiplexer 302 of FIG. 3), and delay chain 504 is connected to the Compare(2) signal. An output of delay chain 502 is coupled to a latching input of register 506. As illustrated within FIG. 6, a set of tap points labeled Taps (1–8) are provided from delay chain 504 to an input of register 506. The output of each tap is a digital signal that indicates whether a rising edge transition of an input signal (at line Compare(2)) has reached that point in the chain or not. It is noted that the system is reset to all zero outputs before each test and that each zero becomes a one as the input signal progresses through the chain.

Delay chain 504 is twice as long as the delay chain 502 (that is, the overall delay of delay chain 507 is twice that of delay chain 502). The output of delay chain 502 is used as a control signal to cause register 506 to latch the current values of taps (1–8) upon its rising edge. Accordingly, when a rising edge of the signal at Compare(1) line propagates through delay chain 502, register 506 latches a value that indicates how far a rising edge of the signal at the Compare(2) Line has progressed along the longer delay chain 504. Since the delay chains 502 and 504 have identical structures, it is expected that the register 506 will indicate that the rising edge of the second input signal progressed approximately half way down the longer delay chain 504 at the point at which the transition in the first input signal exited the delay chain 502. Any variations in the transitions of the signal at the Compare(1) and Compare(2) lines will result in a greater or lesser number of high values latched into register 506. The results of each test may be determined by reading the value within register 506.

It is noted that the compare circuit of FIG. 5 may be calibrated by providing a common input signal to the Compare(1) and Compare(2) lines and by subsequently reading the resulting value of register 506. With this information, it is known what value will be stored within register 506 when identical input signals are provided to delay chains 502 and 504.

Figure 7:
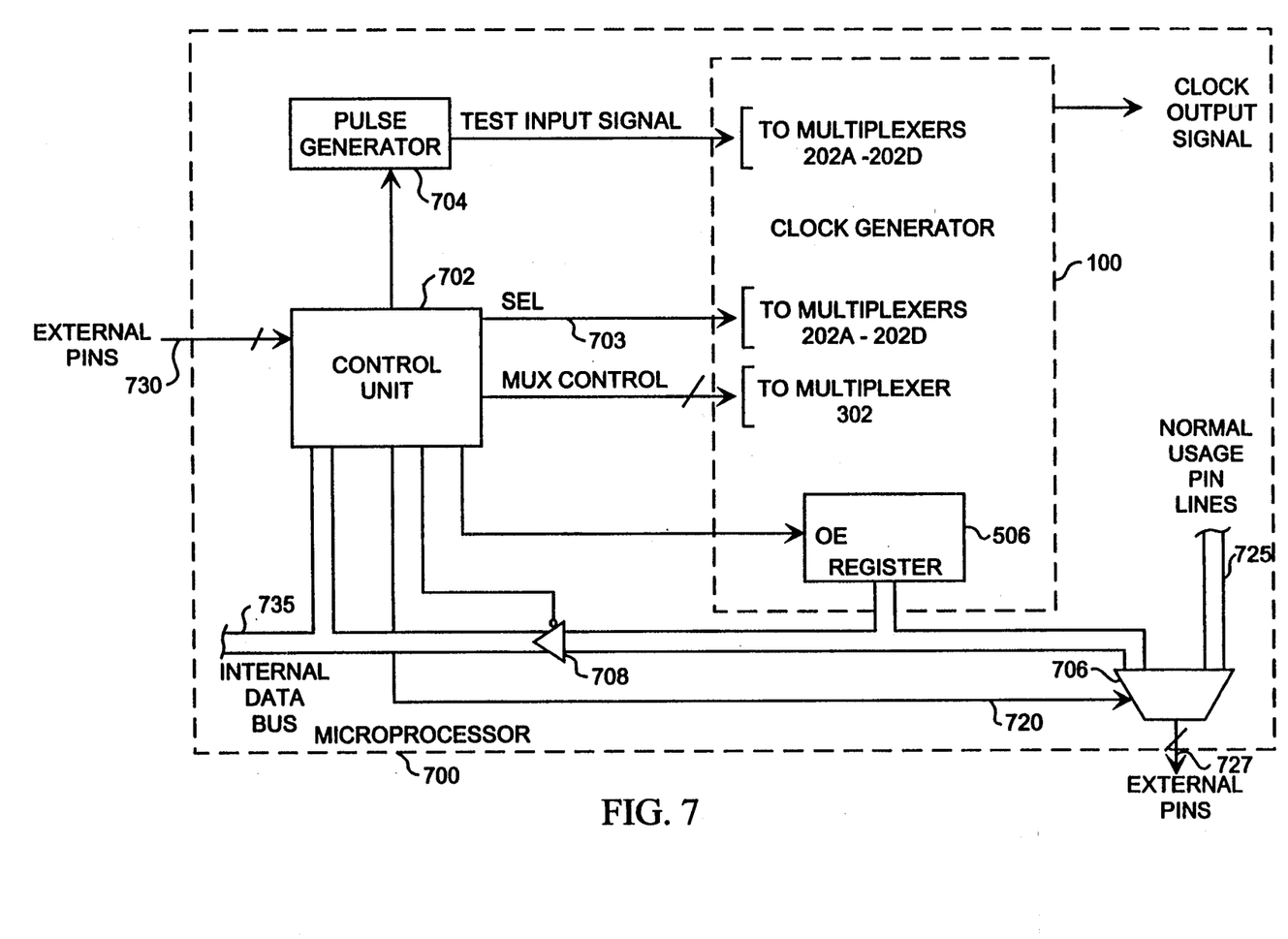
FIG. 7 is a block diagram of a microprocessor that incorporates a configuration for testing a delay chain within a microprocessor clock generator in accordance with the present invention.

Referring finally to FIG. 7, a block diagram of a microprocessor 700 including a clock generator 100 as described previously is shown. The clock generator 100 includes the circuitry illustrated in FIG. 2, as well as the compare unit illustrated in FIG. 5. As illustrated in FIG. 7, the microprocessor 700 further includes a control unit 702 coupled to a pulse generator 704, to a multiplexer 706, and to a driver circuit 708. Circuit portions that correspond to FIGS. 1, 2 and 5 are numbered identically.

Referring collectively to FIGS. 1, 2, 3, 5, and 7, during normal operation of microprocessor 700, control unit 702 drives the SEL control line 703 such that multiplexers 202A–202D are controlled to electrically couple the variable delay units 106A–106D in series with respect to one another. This allows normal operation of clock generator 100 as described previously. During the normal mode of operation, a control line 720 is driven by control unit 702 such that multiplexer 706 provides an electrical channel from a set of normal usage pin lines 725 to a set of external pins 727 of microprocessor 700. It is noted that the set of normal usage pin lines 725 may be employed to transfer any given set of internal microprocessor signals to the external pins 727 of microprocessor 700 during normal operation. For example, normal usage pin lines 725 may be used to transfer various control signals or data signals within microprocessor 700 to the external pins 727.

When a test operation of the microprocessor 700 is desirable in which the internal delay units of clock generator 100 are tested, a command signal is asserted at one or more external pins 730 to cause control unit 702 to enter a test mode. During the test mode, the SEL control line 703 is driven by control unit 702 such that multiplexers 202A–202D electrically decouple the variable delay units 106A–106D, as explained previously. The MUX control signals are further driven such that multiplexer 302 selects test tap#1 and test tap#2 for comparison by compare unit 304. A pulse in the test input signal is then induced by pulse generator 704, and the results of the test are stored within register 506, as was also explained previously. During this mode of operation, control unit 702 may drive the line 720 such that multiplexer 706 allows the contents of register 506 to be driven on the external pins 727. The information within register 506 can then be deciphered by the user to determine whether the variable delay units have the same relative delay. Subsequently, another command signal may be provided to the external pins 730 to initiate a similar test with respect to test tap#2 and test tap#3, and so on.

It is noted that instead of or in addition to providing the contents of register 506 to the external pin 727, the control unit 702 may enable the signal driver 708 such that the contents of register 506 are driven on an internal data bus 735. The contents of register 506 may thereby be read by the control unit 702 for further processing. For example, control unit 702 may perform sequential tests and control the MUX control signals such that each test tap point (i.e., test taps#1–190 4 to multiplexer 302) is compared with respect to another. Control unit 702 may use the results of each test as stored within register 506 to determine whether the delay chain as a whole is working properly. This may be partially implemented via software control.

It is further noted that the test configuration method described above may be advantageously employed within clock generator circuits that include delay chains having any number of variable delay units. Furthermore, although the variable delay units 106A–106D as described in FIG. 1 are digitally controlled delay units, the present invention may also be adapted to delay chains that employ analog controlled delay units.

Numerous variations and modifications will become apparent to those skilled in the art once the above disclosure is fully appreciated. For example, while the embodiment described above in conjunction with FIG. 2 employs multiplexers 202A–202D, other types of switching circuitry could be employed to electrically couple the variable delay units in series during normal operation and to electrically decouple the variable delay units during the testing operation. It is intended that the following claims be interpreted to embrace all such variations and modifications.

What is claimed is:

1. A microprocessor comprising:
   a clock generator including:
   a plurality of variable delay units each including an input line, an output line, and a control line for controlling an electrical delay associated therewith;
   a switching unit interposed between said plurality of variable delay units, wherein said switching unit is capable of electrically coupling said plurality of variable delay units in series during a first mode of operation, and wherein said switching unit is further capable of electrically decoupling said plurality of variable delay units such that a test signal is capable of being simultaneously provided to the input line of each said plurality of variable delay units; and
   a compare unit coupled to the output lines of at least a pair of said plurality of variable delay units, wherein said compare unit is capable of determining whether a transition of said test signal provided simultaneously to said input lines of said pair of said plurality of variable delay units has propagated to the output lines of said pair of said plurality of variable delay units within a relative time range;
   a pulse generator coupled to said switching unit and capable of generating said transition of said test signal; and
   a control unit coupled to said switching unit and capable of receiving a command signal to initiate a test of said clock generator and capable of controlling a switching state of said switching unit.

2. The microprocessor as recited in claim 1 wherein an output of said compare unit is coupled to an external pin of said microprocessor.

3. The microprocessor as recited in claim 1 wherein an output of said compare unit is selectively provided to an external pin of said microprocessor though a multiplexer, wherein said multiplexer is controlled by said control unit.

4. The microprocessor as recited in claim 1 wherein said switching unit includes at least one multiplexer.

5. The microprocessor as recited in claim 4 wherein an output line of said multiplexer is coupled to an input line of one of said plurality of variable delay units and wherein a first input line of said multiplexer is coupled to an output line of a second of said plurality of variable delay units, and wherein a second input line of said multiplexer is coupled to a test signal input node.

6. The microprocessor as recited in claim 1 further comprising a delay control logic unit coupled to the control lines of said plurality of variable delay units, wherein said delay control logic unit is capable of generating a control signal to vary the respective delays of said plurality of variable delay units.

7. The microprocessor as recited in claim 6 wherein a pulse input signal is provided to said plurality of variable delay units during said first mode of operation.

8. The microprocessor as recited in claim 6 wherein said delay control logic unit is capable of adjusting the electrical delays of said plurality of variable delay units such that an overall delay of said plurality of variable delay units substantially equals a period of said pulse input signal.

9. The microprocessor as recited in claim 1 wherein said compare unit includes a first delay chain coupled to the output line of one of said pair of said plurality of variable delay units and a second delay chain coupled to the output line of a second of said pair of said plurality of variable delay units.

10. The microprocessor as recited in claim 9 wherein said compare unit further comprises a register having an input port coupled to a set of tap lines of said second delay chain, wherein said register is latched in response to an output signal from said first delay chain.

11. The microprocessor as recited in claim 10 wherein an output port of said register is coupled to a set of external pins of said microprocessor.

12. The microprocessor as recited in claim 10 further comprising a multiplexer coupled to an output port of said register, wherein a state of said register may be selectively provided to a set of external pins of said microprocessor.

13. The microprocessor as recited in claim 12 wherein said multiplexer is selectively controlled by said control unit.

14. A method for testing a delay chain within a clock generator of a microprocessor including a plurality of variable delay units capable of being electrically coupled in series with respect to one another, said method comprising the steps of:
- providing a test command signal to a control unit of said microprocessor;
- electrically decoupling an output line of a first variable delay unit from an input line of a second variable delay unit in response to said test command signal;
- providing a test signal simultaneously to said first variable delay unit and to said second variable delay unit;
- causing a signal transition to occur in said test signal;
- monitoring an output line of said first variable delay unit while monitoring an output line of said second variable delay unit; and
- determining whether a corresponding transition at the output line of said first variable delay unit occurs within a relative time range of when a corresponding transition at the output line of said second variable delay unit occurs.

15. The method as recited in claim 14 comprising the further steps of:
- varying a control input to said first variable delay unit and a control input to said second variable delay unit to change the electrical delays of said first and said second variable delay units;
- causing a second transition to occur in said test input signal; and
- again determining whether another corresponding transition at said output line of said first variable delay unit occurs within said relative time range of when another corresponding transition at the output line of said second variable delay unit occurs.

16. The method as recited in claim 14 wherein said step of determining comprises the steps of:
- allowing said transition of said test signal to propagate from said first variable delay unit through a first delay chain;
- allowing said transition of said test input signal to propagate from said second variable delay unit into a second delay chain; and
- latching a state of said second delay chain which is indicative of how far the transition propagated through said second delay chain after the transition has propagated completely through said first delay chain.

17. The method as recited in claim 16 further comprising the step of reading said state indicative of how far the transition propagated through said second delay chain.

18. The method as recited in claim 16 wherein said second delay chain is twice as long as said first delay chain.

19. The method as recited in claim 16 comprising the further step of providing said state of said second delay chain to a set of external pins of said microprocessor.

20. The method as recited in claim 19 wherein said step of providing said state of said second delay chain to said set of external pins includes the step of providing said state of said second delay chain through a multiplexer.

* * * * *